United States Patent
Walker et al.

(10) Patent No.: US 9,967,993 B1
(45) Date of Patent: May 8, 2018

(54) PRINTED CIRCUIT BOARD ENCLOSURE ASSEMBLY

(71) Applicant: PHOENIX CONTACT DEVELOPMENT AND MANUFACTURING, INC., Middletown, PA (US)

(72) Inventors: Kevin Walker, Hershey, PA (US); Tod M. Harlan, Mechanicsburg, PA (US); Gottlieb Oyster, Hummelstown, PA (US); Nathan Potteiger, Middletown, PA (US)

(73) Assignee: Phoenix Contact Development and Manufacturing, Inc., Middletown, PA (US)

( * ) Notice: Subject to any disclaimer, the term of this patent is extended or adjusted under 35 U.S.C. 154(b) by 0 days. days.

(21) Appl. No.: 15/344,773

(22) Filed: Nov. 7, 2016

(51) Int. Cl.
*H05K 5/00* (2006.01)
*H05K 7/14* (2006.01)
*H05K 5/03* (2006.01)
*H05K 5/02* (2006.01)

(52) U.S. Cl.
CPC ......... *H05K 7/1427* (2013.01); *H05K 5/0221* (2013.01); *H05K 5/03* (2013.01); *H05K 7/1402* (2013.01); *H05K 7/1418* (2013.01)

(58) Field of Classification Search
CPC ...... H05K 5/0221; H05K 5/03; H05K 7/1402; H05K 7/1418; H05K 7/1427
USPC .................................................. 361/727, 756
See application file for complete search history.

(56) References Cited

U.S. PATENT DOCUMENTS

| | | | |
|---|---|---|---|
| 3,864,007 A | 2/1975 | Plyler et al. | |
| 4,022,326 A | 5/1977 | Marconi | |
| 4,585,122 A | 4/1986 | Stegenga | |
| 4,676,575 A | 6/1987 | Denlinger et al. | |
| 4,871,329 A | 10/1989 | Van Der Meer | |
| 5,285,895 A | 2/1994 | Bolt | |
| 5,477,421 A | 12/1995 | Bethurum | |
| 5,531,328 A | 7/1996 | Rochelo et al. | |
| 5,942,728 A | 8/1999 | Chen | |
| 6,094,349 A | 7/2000 | Fassel et al. | |
| 6,097,605 A | 8/2000 | Klatt et al. | |
| 6,137,689 A | 10/2000 | Schechtel et al. | |
| 6,178,094 B1 | 1/2001 | Hakozaki | |
| 6,304,456 B1 | 10/2001 | Wortman | |
| 6,329,593 B1 | 12/2001 | Yang | |
| 6,341,063 B2 * | 1/2002 | Kinoshita ............ | H05K 5/0039 361/690 |
| 6,356,456 B2 | 3/2002 | Eskildsen | |
| 6,398,567 B1 | 6/2002 | Nishimura | |
| 6,763,691 B1 | 7/2004 | Rafferty | |
| 6,776,632 B2 | 8/2004 | Kikuchi et al. | |
| 6,816,388 B2 * | 11/2004 | Junkins ................ | H05K 7/1418 361/727 |
| 7,094,075 B1 | 8/2006 | Lim et al. | |
| 7,125,258 B2 | 10/2006 | Nakakubo et al. | |

(Continued)

OTHER PUBLICATIONS

Photograph of a prior art PCB having a latch mounted thereto, the latch allowing partial PCB withdrawal from an enclosure interior, 1998.

*Primary Examiner* — Hung S Bui

(74) *Attorney, Agent, or Firm* — Hooker & Habib, P.C.

(57) ABSTRACT

An enclosure assembly for housing printed circuit boards and related electrical components that provides secured component mounting in outdoor environments.

15 Claims, 19 Drawing Sheets

(56) References Cited

U.S. PATENT DOCUMENTS

| | | |
|---|---|---|
| 7,140,885 B2 | 11/2006 | Kitamura |
| 7,190,589 B2 | 3/2007 | Caines et al. |
| 7,275,941 B1 | 10/2007 | Bushby |
| 7,369,413 B2 | 5/2008 | Caines et al. |
| 7,413,479 B1 | 8/2008 | Volpone |
| 7,417,868 B2 | 8/2008 | Morisada |
| 7,542,294 B2 | 6/2009 | Caines et al. |
| 7,553,180 B2 | 6/2009 | Hu et al. |
| 7,686,623 B2 | 3/2010 | Honda et al. |
| 7,815,449 B2 | 10/2010 | Maruyama |
| 8,435,048 B2 | 5/2013 | Fahllund et al. |
| 8,523,581 B2 | 9/2013 | Martin et al. |
| 8,725,198 B2 | 5/2014 | Wang et al. |
| 8,747,131 B2 | 6/2014 | Nakase et al. |
| 9,414,510 B2 | 8/2016 | Lei |
| 9,493,126 B2 * | 11/2016 | Yang .................. B60R 16/0239 |
| 2001/0017767 A1 * | 8/2001 | Kitamura ............. H05K 5/0039 361/752 |
| 2012/0027511 A1 | 2/2012 | Wei et al. |
| 2016/0073540 A1 | 3/2016 | Chang |
| 2016/0095233 A1 | 3/2016 | Kusumi |

\* cited by examiner

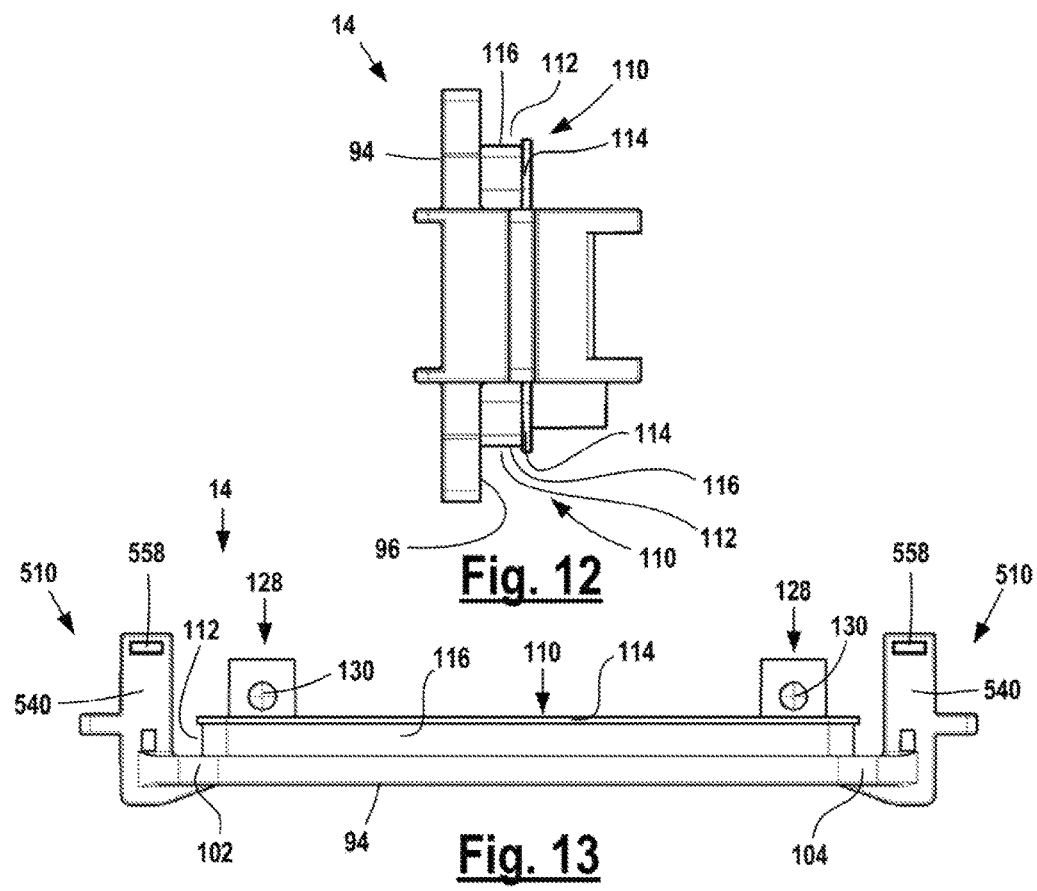
Fig. 12
Fig. 13
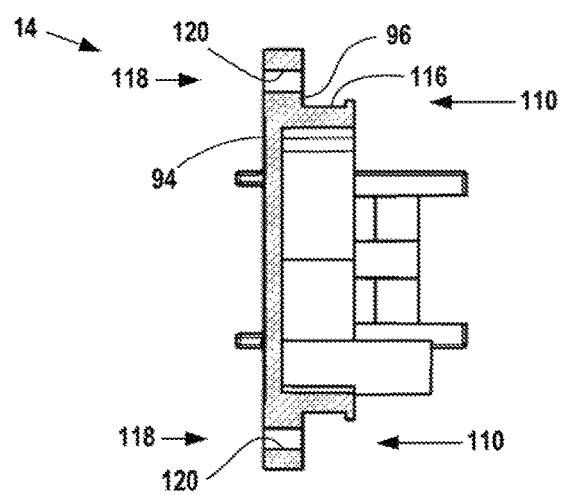
Fig. 14

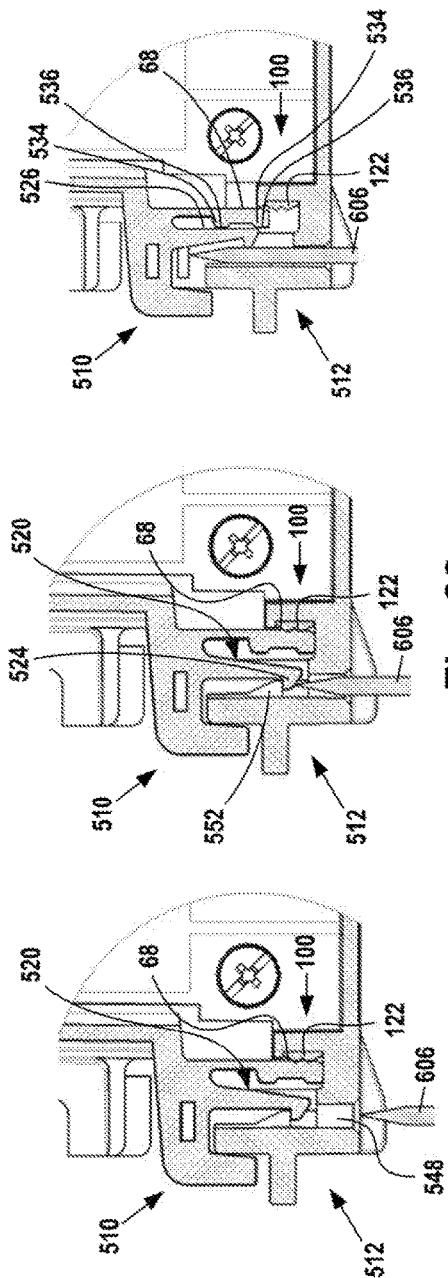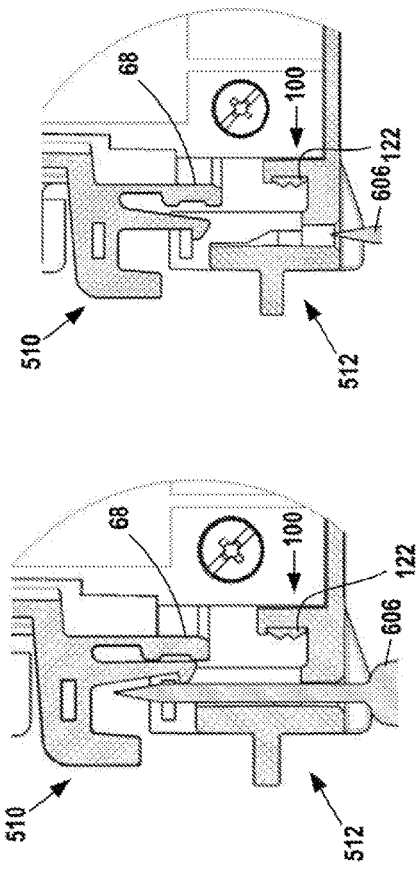

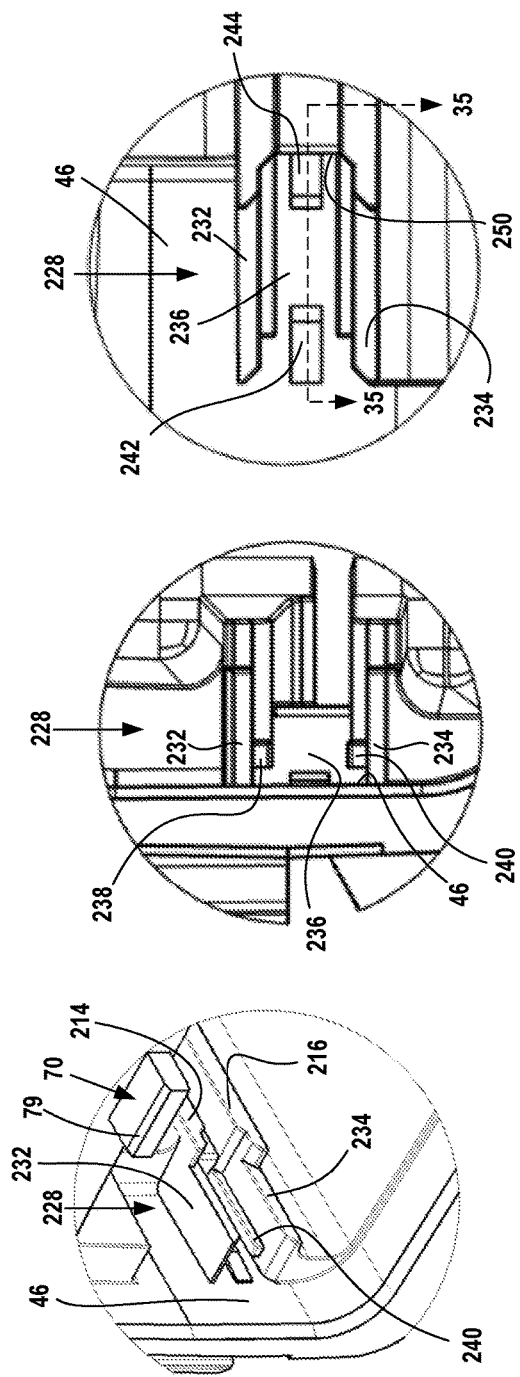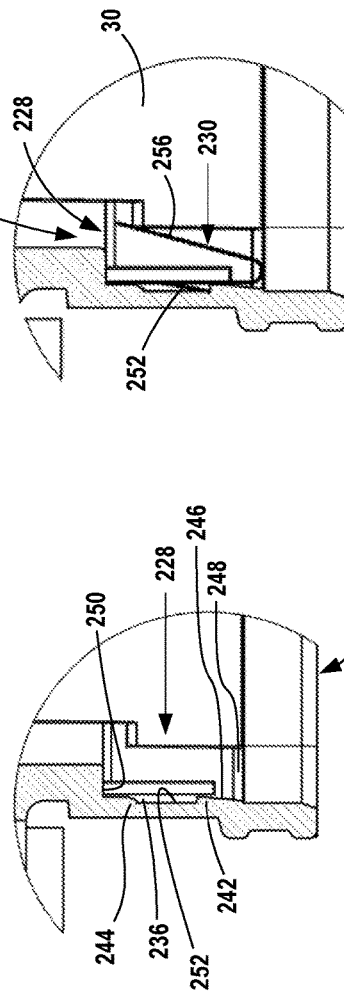

PRINTED CIRCUIT BOARD ENCLOSURE ASSEMBLY

FIELD OF THE DISCLOSURE

The disclosure relates to enclosures for electrical components and in particular to sealed circuit board enclosures which are adapted for outdoor use.

BACKGROUND OF THE DISCLOSURE

Enclosures for housing printed circuit boards (PCBs) and like electrical components are known. Enclosures are typically made of plastic or metal and are designed to house PCBs and electrical components in controlled, stable environments. Enclosures for housing electrical components outdoors are designed to house the components in stable environments despite environmental changes outside the enclosures.

Maintaining reliable electrical components in outdoor enclosures is challenging because the outdoor environment is unstable and can damage components inside the enclosures. In particular, electrical components can be damaged by moisture seeping into the enclosures. Even when an enclosure body and cover are impermeable to moisture, the failure of a seal between the body and cavity can permit moisture to seep into the enclosure damage components.

Other challenges arise with housing electrical components in outdoor environments.

Enclosures for electrical components typically include an enclosure body and a removable cover. When the enclosure cover is removed to access the enclosure interior for circuit board installation or service, the PCB can be dislodged, escaping the enclosure interior and be lost or damaged. These risks are increased when enclosures are mounted on poles, towers, building sides or like supports above ground level. Enclosure service may be conducted from ladders, scaffolding or other supports at height. In these situations, it can be difficult to secure a PCB when opening an enclosure.

Challenges also arise in securing an enclosure cover on an enclosure body. It is known to provide an enclosure cover having latches with security features to prevent tampering. To unlatch the cover, an elongate tool such as a screwdriver is extended into an access aperture to displace a latch. The tool can over-deflect the latch, causing damage to the latch.

Other challenges arise in securely mounting printed circuit boards of different thicknesses in an enclosure. The PCB's must be held against movement in the enclosure and not be loose. Conventional enclosures have adaptable mounting means and/or provide different enclosure bodies sized to accept different thickness PCBs, adding to enclosure complexity and cost.

Thus, it is desirable to provide an enclosure assembly for housing an electrical component having sealing elements at the enclosure opening that secures against moisture seepage, retention elements to prevent the unintended dislodging of components from the enclosure, elements to prevent actuating latch to over-deflection causing latch damage and elements to allow the mounting of various thickness PCB's into a single enclosure body to overcome the challenges mentioned above.

BRIEF SUMMARY OF THE DISCLOSURE

Disclosed is an improved enclosure assembly for housing an electrical component, particularly an assembly having an outdoor-mounted enclosure housing for a printed circuit board with electrical components mounted on the circuit board. The disclosed enclosure has lug and aperture elements and sealing elements at the enclosure mouth which form a secured physical connection that prevents moisture seepage; retention elements to prevent the unintended dislodging and escape of PCBs from the enclosure; elements to prevent opening latch over-deflection damage; and elements allowing the mounting of different thickness PCBs in the enclosure.

The disclosed enclosure assembly sealing elements include lug projections that extend into apertures on the enclosure cover to prevent outward flexing on enclosure body walls away from the enclosure cover. Outward wall flexing can cause seal loss between the enclosure and enclosure cover at the enclosure mouth.

The disclosed enclosure assembly has PCB retention latches that permit partial withdrawal of the PCB from the enclosure for servicing but prevent the PCP from separating and escaping fully from the enclosure. The retention latches permit a technician to partially remove the PCB from the enclosure for inspection and servicing of the PCB without the need to completely remove the PCB from the enclosure. The retention latches must be manually disengaged by a technician to fully remove the PCB from the enclosure, preventing unintended PCB escape, loss and damage.

The enclosure assembly cover latch prevents latch over-deflection and damage.

The enclosure assembly includes specialized mounting slots that accommodate different thickness printed circuit boards in the enclosure.

Other objects and features will become apparent as the description proceeds, especially when taken in conjunction with the accompanying drawing sheets.

BRIEF DESCRIPTION OF THE DRAWINGS

FIG. 12 is a side view of the assembly cover;

FIG. 13 is a top view of the assembly cover;

FIG. 14 is a sectional view taken along line 14-14 of FIG. 10;

FIGS. 21-25 are sectional views showing unlatching of the enclosure assembly;

FIG. 32 is a perspective detail view of a slot latch housing;

FIG. 33 is a front view of the slot latch housing;

FIG. 34 is a front view of the slot latch housing;

FIG. 35 is a sectional view taken along line 35-35 of FIG. 34;

FIG. 36 is a sectional view like FIG. 35 showing the installed slot latch;

DETAILED DESCRIPTION

Figure 1:
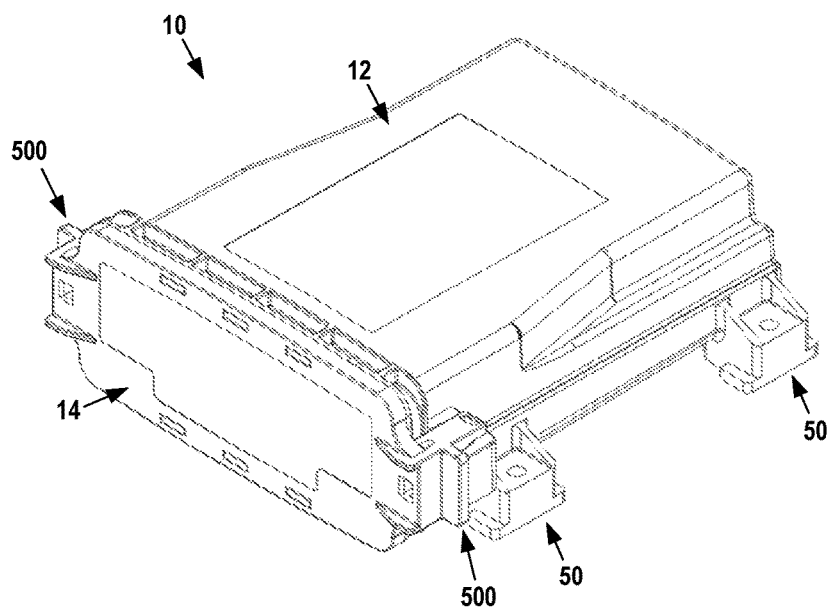
FIG. 1 is a perspective view of the disclosed enclosure assembly.

FIG. 1 shows an enclosure assembly 10 having an enclosure body 12 and an enclosure cover or faceplate 14. As shown in the figures, enclosure body 12 is generally rectangular and enclosure cover 14 is generally flat. Enclosure body 12 and enclosure cover 14 may be molded from plastic.

Enclosure body 12 is made up of five body walls: top wall 18, bottom wall 20, side walls 22, 24, and rear wall 26. Enclosure mouth 28 leads into enclosure internal cavity 30. The surrounding body walls define cavity 30 which is generally rectangular.

The body walls have the following surfaces: top wall exterior surface 32, bottom wall exterior surface 34, side wall exterior surfaces 36, 38, rear wall exterior surface 40, top wall interior surface 42, bottom wall interior surface 44, side wall interior surfaces 46, 47 and rear wall interior surface 48.

Figures 4, 5:
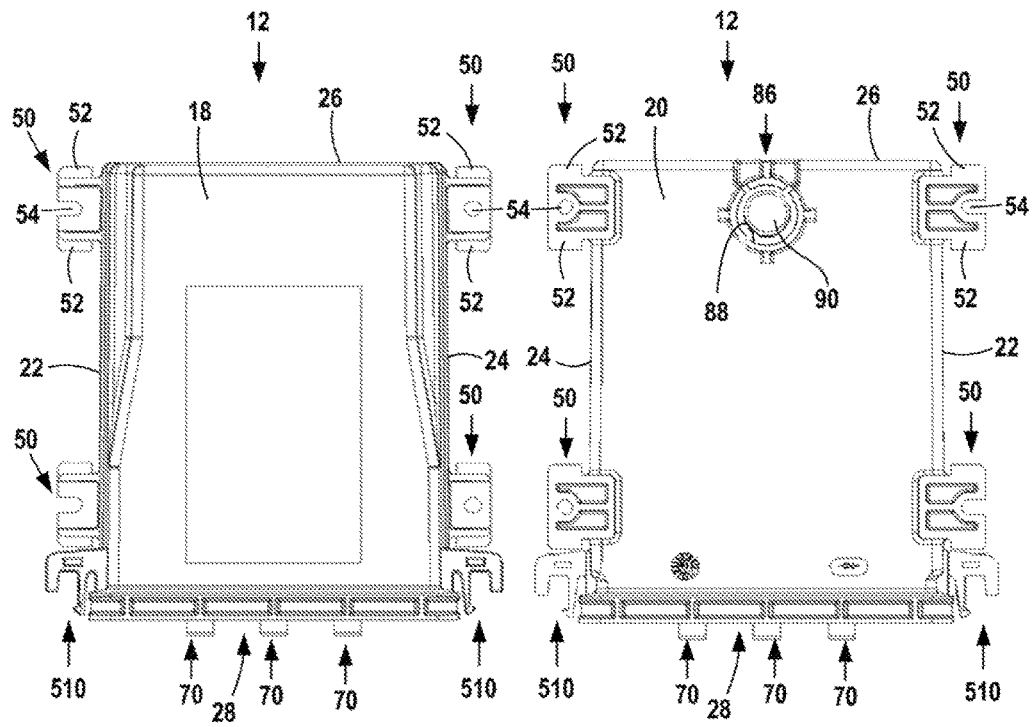
FIG. 4 is a top view of the enclosure body.
FIG. 5 is a bottom view of the enclosure body.
Figure 6:
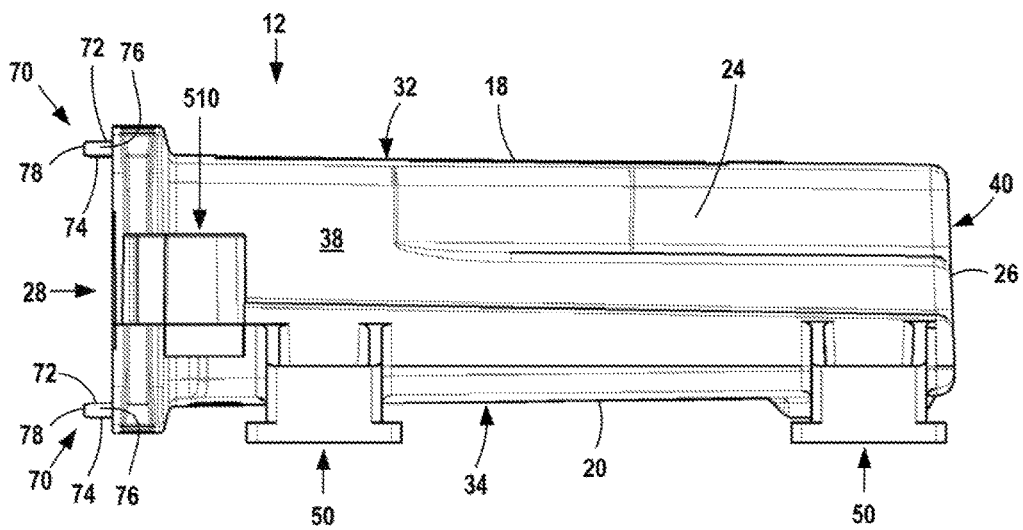
FIG. 6 is a side view of the enclosure body.

Four enclosure assembly feet 50 extend from the bottom of body 12 proximate side walls 22, 24 and enclosure bottom wall 20. Each foot 50 is generally rectangular and may have foot flange portions 52 extending from the sides of the foot and/or foot apertures 54 extending through the foot body. As illustrated in FIGS. 4 and 5, foot apertures 54 may be surrounded by a foot 50 or be open to the exterior of foot 50.

Foot flange portions 52 and/or foot apertures 54 may be used to secure enclosure assembly 10 in place on a support, either by extending a fastener through apertures 54 or by engaging foot flange portions 52.

Enclosures front mouth 28 has circumferentially-extending mouth lip or bezel 56. Mouth lip 56 has a flat, circumferential lip surface 58 extending around mouth 28 and facing out or away from internal cavity 30. Lip surface 58 is made up of lip surface top portion 60 proximate top wall 18, a lip surface bottom portion 62 proximate bottom wall 20, a lip surface side portion 64 proximate side wall 22 and lip surface side portion 66 proximate side wall 24.

Figure 8:
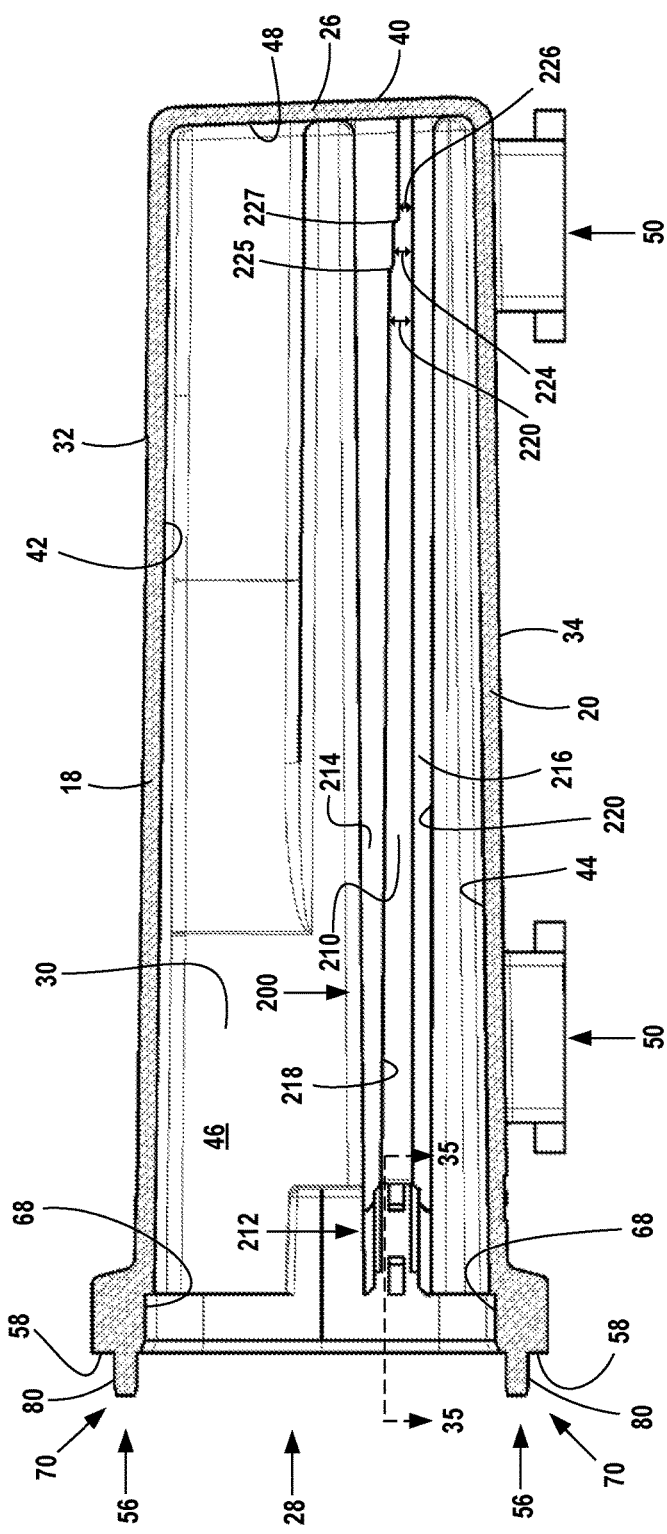
FIG. 8 is a sectional view taken along line 8-8 of FIG. 7.

Enclosure front mouth 28 includes circumferential enclosure seal surface 68 which extends about and is located inwardly of lip surface 58. Surface 68 is generally flat, extending from lip 56 and into internal cavity 30. Surface 68 extends circumferentially around mouth 28 and faces inwardly toward internal cavity 30. See FIG. 8.

Mouth lip 56 includes a number of retention projection lugs 70. Lugs 70 extend away from internal cavity 30 and are generally rectangular, having a lug top wall 72, a lug bottom wall 74, a lug side wall 76 and a lug front wall 78. In embodiments, lug 70 may include an angled chamfer surface 79 adjacent lug front wall 78.

Figure 7:
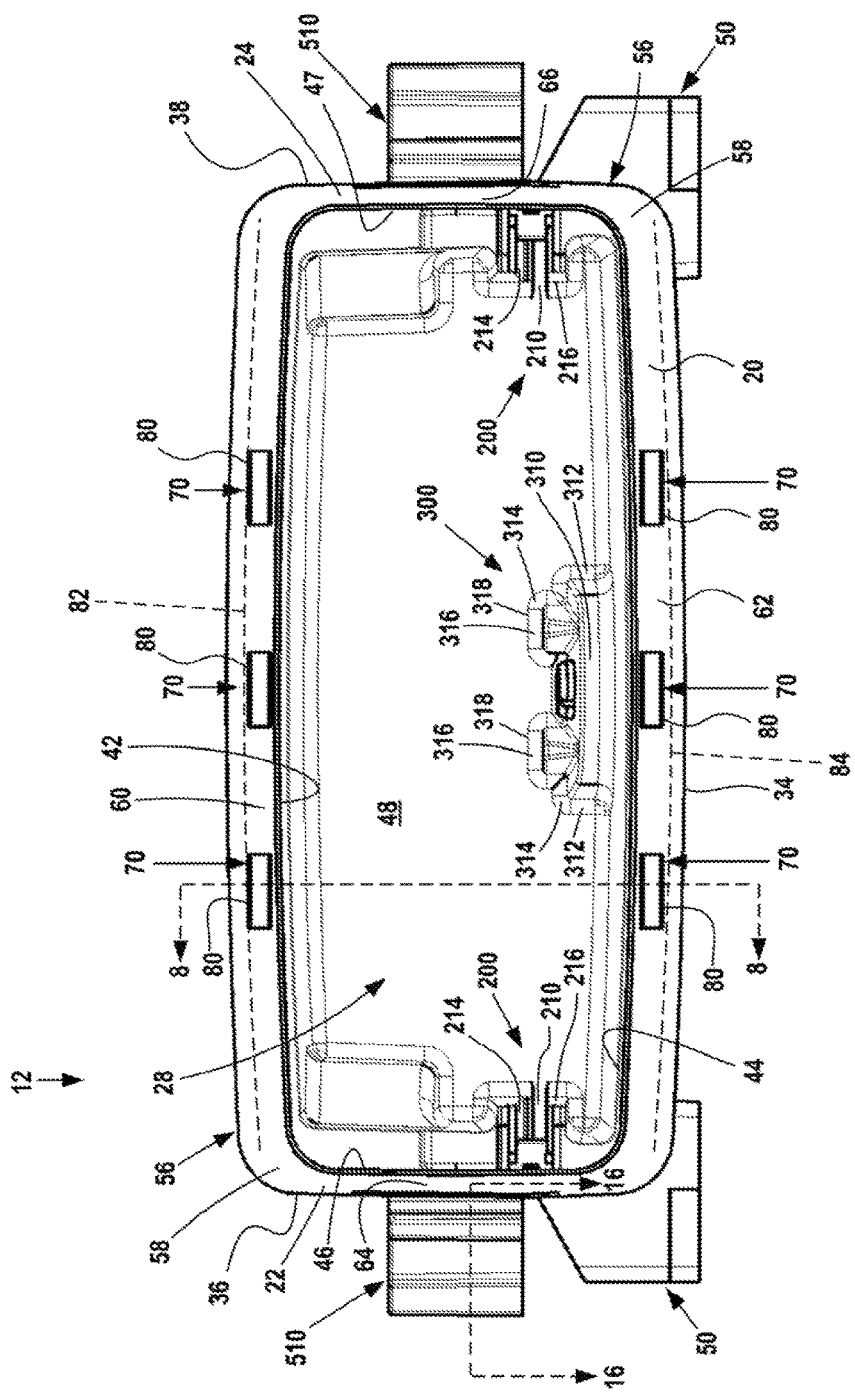
FIG. 7 is a front view of the enclosure body.

Lugs 70 include enclosure retention surface 80 on walls 72, 74. Surface 80 is generally flat, extending from lip 56 away from internal cavity 30. Surfaces 80 face outwardly away from seal surface 68. See FIGS. 7 and 8.

While the attached figures show projection lugs 70 are rectangular, other projection shapes are contemplated, including cylindrical retention projections extending from mouth lip 56 or other shapes, so long as the lug supports have outwardly facing retention surface 80.

Three lugs 70 are spaced along lip top portion 60, with three lugs 70 spaced along lip surface bottom portion 62. In alternate embodiments, other numbers of lugs may be spaced along lip portions 60, 62.

Enclosure body top wall 18 is generally flat with an outwardly-curving top arch 82 extending between side walls 22, 24. Enclosure body bottom wall 20 is generally flat with an outwardly-curving bottom arch 84 extending between side wall 22, 24. See FIG. 7. Top and bottom wall arches 82, 84 help stabilize top and bottom walls 18, 20 against outwardly-deforming forces.

Enclosure body 12 may include a vent assembly. In the attached figures, vent assembly 86 is shown on bottom wall 20, but may be placed in other enclosure walls if desired. The vent assembly is made up of a vent aperture 88 extending through bottom wall 20 and into cavity 30 and a seal element 90 seated within vent aperture 88. Seal element 90 includes a breathable, waterproof membrane that repels the passage of liquid water while allowing air and water vapor to pass through aperture 88. This allows the pressure within a sealed cavity 30 to equalize to external atmospheric pressure thus preventing the formation of moisture condensate that may damage components mounted within assembly 10 including electric components on a PCB in the assembly. Seal element 90 may utilize "GORE-TEX" brand fabric material manufactured by W. L. Gore & Associates, Inc. or other comparable fabrics as a membrane component.

Enclosure cover 14 has a generally flat, rectangular shaped cover body 92. Cover body 92 has a front face 94 and a rear face 96. Cover top and bottoms portions 98, 100 extend between cover side portions 102, 104.

Enclosure assembly 10 may have means to transmit the electrical power and/or data signals to and from an electrical component mounted within enclosure body 12. Electrical power may be transmitted from a power source outside enclosure assembly 10 to an electrical component in cavity 30. Data signals may be transmitted between an electrical component in cavity 30 and a component located outside of the assembly. Transmission means may include one or more apertures extending through enclosure cover 14 or enclosure body 12 body walls 18, 20 ,22, 24, and 26, the apertures allowing use of a cable and cable glad. The cable gland allows a technician to pass the cable into assembly 10 while sealing out moisture and undesired foreign matter from cavity 30. The transmission means may also include an electrical socket connector extending through enclosure cover 14 or cover body 92, the electrical socket connector allowing interconnection of electrical power and/or data signal cables to an electrical component mounted within enclosure body 12. The means may also include the wireless transmission of data signals between a wireless transmitter/receiver an electrical component in cavity 30 and a component located outside of the assembly. In applications where the electrical component mounted within enclosure body 12 is powered by a self-contained battery or like power source, the electrical component in cavity 30 may not require electrical power provided from a power source outside enclosure assembly.

Figure 10:
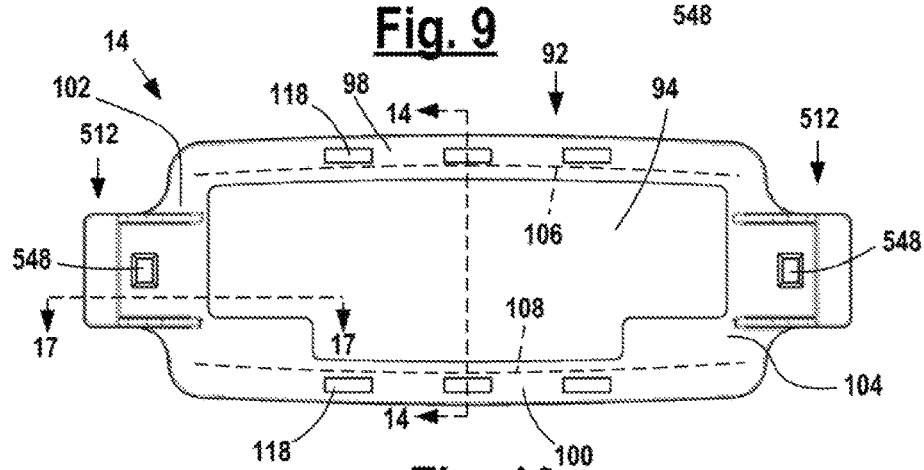
FIG. 10 is a front view of the assembly cover.

Cover top portion 98 has an upwardly-curving top arch 106 extending between side portions 102, 104. Cover bottom portion 100 has a downwardly-curving bottom arch 108 extending between portions 102, 104. See FIG. 10. Top and bottom arches 106, 108 have generally similar arc lengths as top and bottom wall arches 82, 84.

Cover rear face 96 has a circumferential seal mounting member 110. Member 110 extends to one side of face 96 and includes circumferential channel 112. Channel 112 includes a channel lip 114 and circumferential cover seal surface 116. Surface 116 extends circumferentially around member 110 and faces outwardly and away from internal cavity 30 when cover 14 is mounted on enclosure 12.

Enclosure cover 14 has a number of retention lug apertures 118. Each retention lug aperture 118 extends through cover 14 from front face 94 to rear face 96 and has a generally rectangular shape matching the rectangular shape of lugs 70.

Each retention lug aperture 118 includes a cover retention surface 120. Surface 120 is generally flat, extending between cover faces 94, 96 and faces inwardly toward internal cavity 30 when cover 14 is mounted on enclosure 12. Each cover retention surface 120 is shaped to engage an enclosure retention surface 80 when cover 14 is mounted on enclosure 12.

As shown in the figures, a set of three retention lug apertures 118 are spaced along cover top portion 98, with a corresponding set of three retention lug apertures 118 spaced along cover bottom portion 100. In other embodiments, other numbers of retention lug apertures may be spaced along portions 98, 100 to accommodate corresponding enclosure lugs 70. Likewise, while the present drawings show retention lug apertures 118 as rectangular, other aperture shapes are contemplated to conform to the shape of a lug 70, so long as the retention lug apertures engage a complementary, inwardly facing cover retention surface 120.

Figure 27:
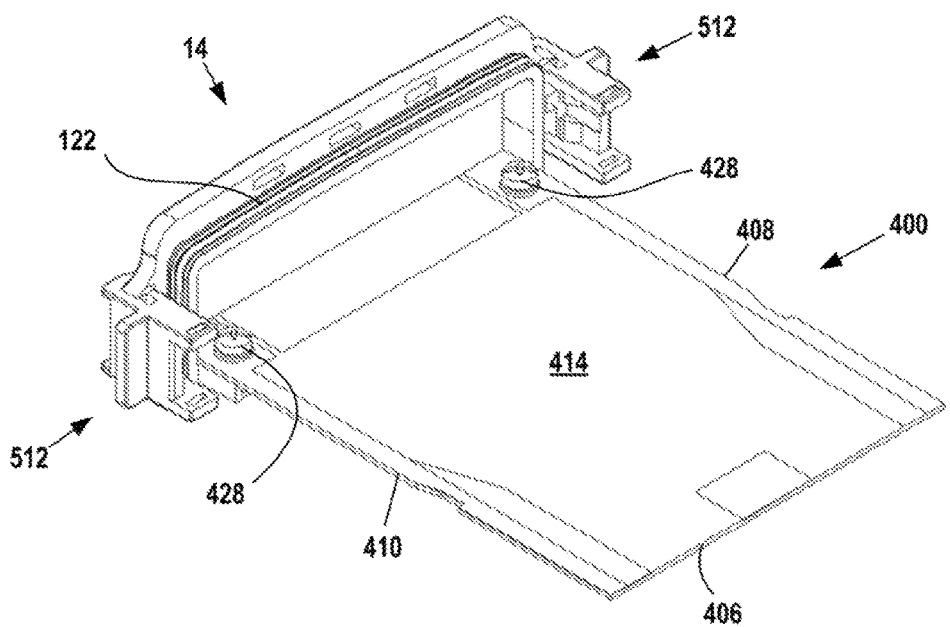
FIG. 27 is a perspective view showing an assembly printed circuit board mounted to an assembly cover.

Seal mounting member 110 is adapted to hold a circumferential seal member 122 within channel 112. See FIGS. 15 and 27.

Figure 2:
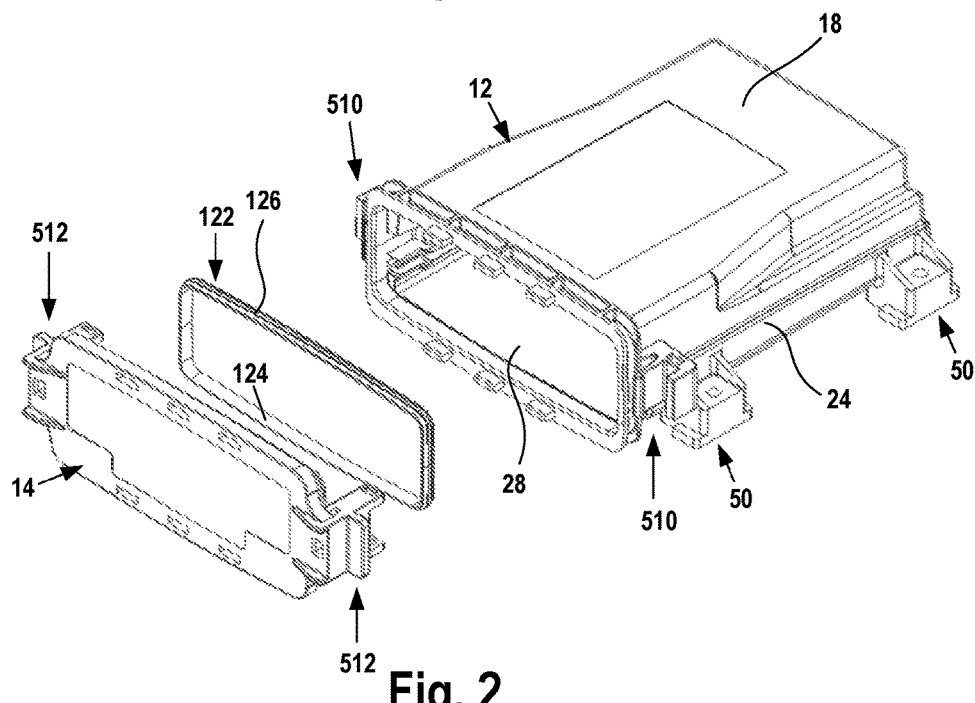
FIG. 2 is an exploded view of the disclosed enclosure assembly.
Figure 3:
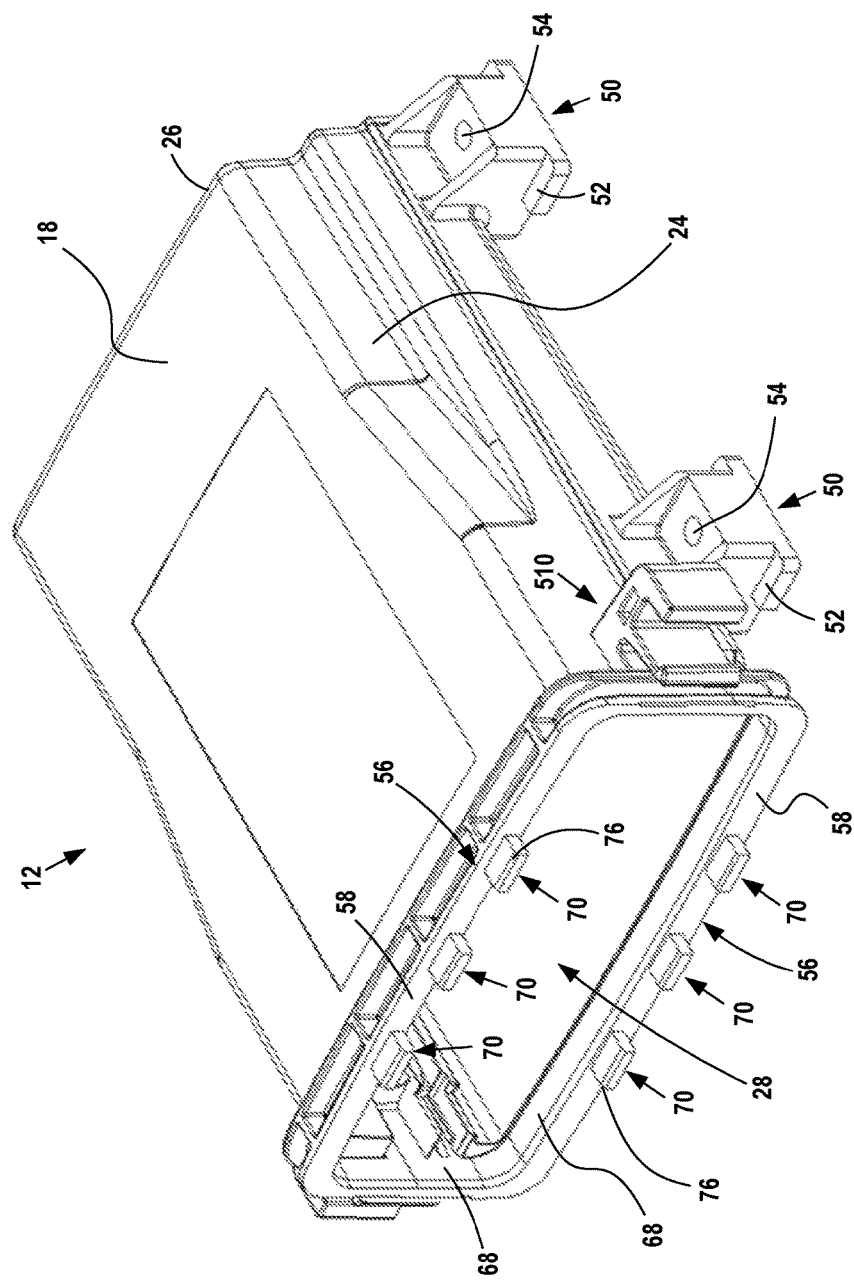
FIG. 3 is a perspective view of the enclosure body.

Seal member 122 is generally rectangular in shape as shown in FIG. 2. Seal member 122 may be made of rubber, silicone or a like elastomeric substance. Seal member 122 has an inner seal surface 124 and an outer seal surface 126. Surfaces 124, 126 extend circumferentially around member 122. Inner seal surface 124 faces inwardly and toward internal cavity 30 when cover 14 is mounted on enclosure 12. Outer seal surface 126 faces outwardly and away from internal cavity 30 when cover 14 is mounted on enclosure 12.

Seal member 112 facilitates formation of a secure, moisture-proof seal when cover 14 is mounted on enclosure mouth 28 as explained in greater detail below.

Cover rear face 96 also has PCB mounting members 128 located proximate cover side portions 102, 104. Mounting members 128 have a generally flat, rectangular body and a mounting aperture 130 extending through the body. See FIG. 13. A conventional fastener is extended through aperture 130 to secure a PCB to the cover 14 as explained in greater detail below.

Enclosure body 12 interior cavity 30 has elements that facilitate the installation of a printed circuit board therein.

Enclosure side wall interior surfaces 46, 47 each have a PCB edge holder 200. Each edge holder 200 faces the edge holder 200 on an opposed side wall interior surface.

Each edge holder 200 has a PCB mounting slot 210 and a slot latch assembly 212. PCB mounting slot 210 extends generally from front mouth 28 to enclosure rear wall 26. Slot latch assembly 212 is in slot 210 adjacent to enclosure front mouth 28.

PCB mounting slot 210 has upper and lower slot walls 214, 216. Upper and lower slot walls 214, 216 extend from each side wall interior surface 46, 47 into cavity 30. Upper slot wall 214 includes downwardly-facing retention surface 218. Lower slot wall 216 includes upwardly-facing retention surface 220.

PCB mounting slot 210 provides a sliding surface for mounting a PCB into cavity 30, the sliding surface extending from mouth 28 to rear wall 26.

The height of slot 210 varies and may taper from a larger height at mouth 28 to a smaller height at rear wall 26. Slot 210 has a first minimum slot height 222 away from front mouth 28. Slot 210 has a stepped down, sequentially smaller second and third slot heights 224 and 226 adjacent to enclosure rear wall 26. See FIG. 8.

First slot height 222 is sufficient to accommodate insertion of a first PCB having a uniform board thickness less than the height 222 along the length of slot 210. Second slot height 224 is slightly less than the board thickness of the first PCB. An interference-fit is formed between the first PCB and slot 210 when the board is inserted beyond slot step 225.

Second slot height 224 is sufficient to accommodate insertion of a second PCB having a uniform board thickness less than the heights 222 and 224 along the length of slot 210. Third slot height 226 is slightly less than the board thickness of the second PCB. An interference-fit is formed between the second PCB and slot 210 when the board is inserted beyond slot step 227.

First slot height 222 may be greater than 0.093 inches to accommodate insertion of a first PCB having a board thickness of 0.093 inches. Second slot height 224 may be sized to provide an interference fit with a first PCB having a board thickness of 0.093 inches. Third slot height 226 may be sized to provide an interference fit with a second PCB board having a thickness of about 0.062 inches. The interference-fit between the PCB and slot 210 holds the PCB against movement in the enclosure.

Slot latch assembly 212 has a slot latch housing 228 and a slot latch 230.

Slot latch housing 228 has upper and lower slot latch assembly walls 232, 234 that define a slot latch housing recess 236 located there-between. Upper and lower slot latch assembly walls 232, 234 extend from each side wall interior surface 46, 47 toward cavity 30 and are located outwardly from upper and lower slot walls 214, 216. See FIG. 32.

Slot latch housing 228 also has upper and lower retention bodies 238, 240 extending from upper and lower slot latch assembly walls 232, 234 and toward slot latch housing recess 236. Slot latch housing front and back retention bodies 242, 244 extend outwardly from an enclosure side wall interior surface 46, 47 and toward slot latch housing recess 236. Slot latch housing front retention body 242 has a cam surface 246 facing mouth 28. Slot latch housing opening 248 is at mouth 28. Slot latch housing rear wall 250 is formed in enclosure side walls 22, 24. See FIG. 35.

Latch spur retention slot 252 is defined by upper and lower retention bodies 238, 240 and front and back retention bodies 242, 244.

Figures 29, 30, 31:
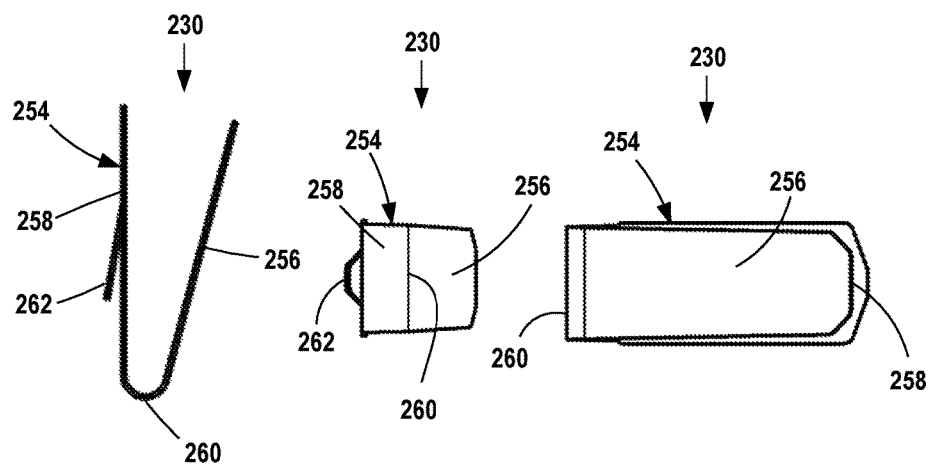
FIG. 29 is a side view of a slot latch used with the assembly.
FIG. 30 is a rear view of the slot latch.
FIG. 31 is a top view of the slot latch.

Slot latch 230 is illustrated in FIGS. 29-31. Latch 230 has a V-shaped latch body 254 that may be made of spring steel or a like material. Latch mounting arm 256 and latch retention arm 258 are joined by latch spring bend 260. Spring bend 260 biases latch mounting arm 256 away from latch retention arm 258 when the spring is compressed. Latch mounting arm 256 has a latch mounting spur 262 extending away from retention arm 258.

Slot latch 230 is installed into slot latch housing 228 by extending retention arm 258 into slot latch housing recess 236 so that arm 258 is located between upper and lower retention bodies 238, 240, the free end of retention arm 258 is seated against slot latch housing rear wall 250 and latch mounting spur 262 is located in latch spur retention slot 252. Mounting spur 262 holds retention arm 258 in place to secure slot latch 230 within latch housing 228. When installed, latch mounting arm 256 extends toward cavity 30. See FIG. 36.

Alternatively, retention arm 258 may be press-fit or interference fit into slot latch housing recess 236 to secure slot latch 230 in slot latch housing 228.

In other versions, enclosure body 12 interior cavity 30 may have other elements to facilitate the installation of an electrical component. Electrical components may be mounted to enclosure body interior wall surfaces 42, 44, 46, 47 or 48 by conventional fasteners, adhesives or the like.

Figure 15:
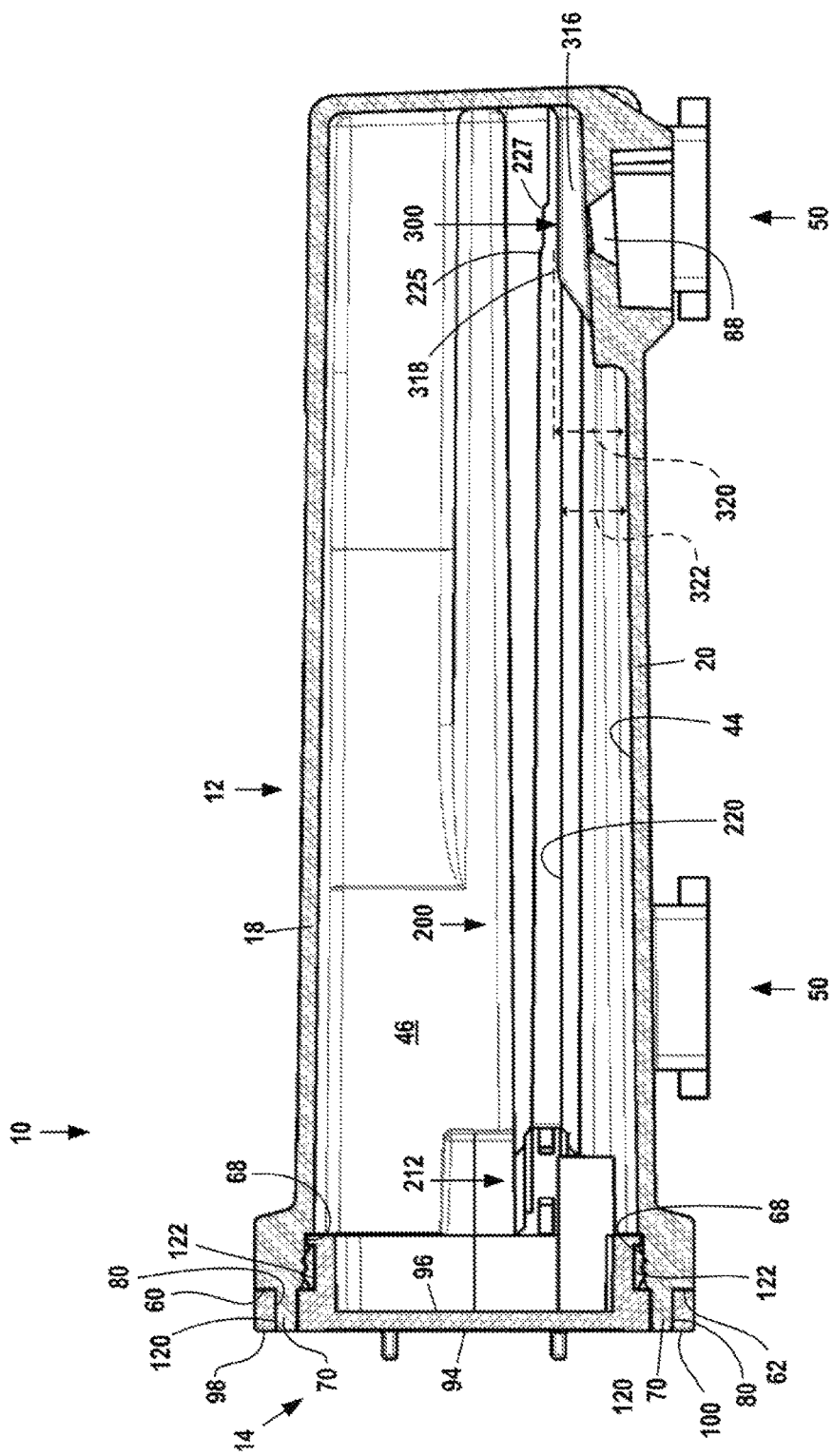
FIG. 15 is a sectional side view of the enclosure assembly shown in FIG. 1.

Enclosure body 12 interior cavity 30 includes a board deformation assembly 300 which is mounted on enclosure bottom wall 20 and extends up into cavity 30. Assembly 300 has a body 310 with vertical side walls 312 and a top portion 314. Two board engagement bodies 316 extend upwardly from top portion 314. Each engagement body 316 has a generally flat board engagement surface 318. Board engagement surfaces 318 are located a vertical distance 320 above enclosure bottom wall interior surface 44. As illustrated in FIG. 15 distance 320 is greater than distance 322 between bottom wall interior surface 44 and lower slot wall 216 upwardly-facing retention surface 220.

A printed circuit board (PCB) 400 is mounted in enclosure assembly 10. PCB 400 has a flat, rectangular body 402 with a front end 404, a rear end 406, opposed edges 408, 410 and a uniform body thickness 412 between body top and bottom faces 414, 416. Electrical components and conductive tracks, pads and other conductive features are mounted onto a non-conductive substrate forming PCB 400. Alternatively, PCB 400 may have a flat, rectangular substrate body lacking conductive tracks, pads or other conductive features and having an electrical component is mounted to body top or bottom face 414, 416.

Figure 26:
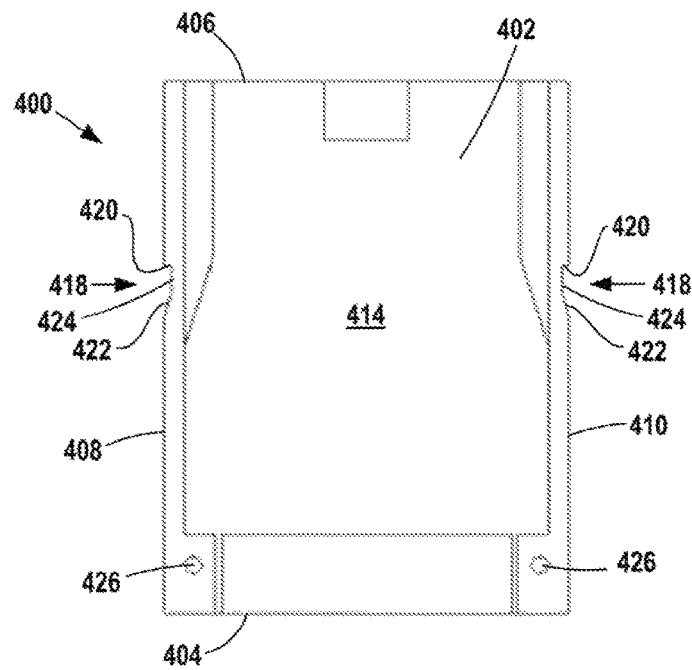
FIG. 26 is a top view of an assembly printed circuit board.

Board retention notches 418 are located in opposed PCB edges 408, 410 approximately mid-way between board front and rear ends 404, 406. Each board retention notch 418 includes a wall stop portion 420 proximate board rear end 406 and facing PCB front end 404. Each board retention notch 418 also includes angled cam and flat portions 422, 424 extending away from wall stop portion 420 toward board front end 404. See FIG. 26.

While notches 418 are shown as generally rectangular in shape, other shapes are contemplated, so long as notches 418 include a stop portion 420 facing PCB front end 404.

Cover mounting apertures 426 are located proximate board front end 404 and permit mounting of PCB 400 on cover 14. Cover mounting apertures 426 are aligned with the PCB mounting member mounting apertures 130 on cover 14. Conventional fasteners 428 are extended through apertures 426 and 130 to secure PCB 400 to cover 14. Cover PCB mounting members 128 and board cover mounting apertures 426 provide a physical connection to mount PCB 400 to cover 14. See FIG. 27.

Latch assemblies 500 are integrated parts of molded plastic enclosure 12 and molded plastic cover 14. The assemblies allow the secure mounting of cover 14 to enclosure 12. Each latch assembly 500 is made up of an enclosure latch sub-assembly 510 and a cover latch sub-assembly 512. Enclosure latch sub-assemblies 510 are located on enclosure side walls 22, 24 at front mouth 28. Cover latch sub-assemblies 512 are located on cover side portions 102, 104.

Enclosure latch assembly 510 has a support wall 514 extending out from enclosure sides 22, 24 and an end wall 516 extending from wall 514 parallel to enclosure side walls 22, 24. Latch recess 518 is located between end wall 516 and enclosure sides 22, 24 and houses a latch 520. Latch 520 extends forwardly from support wall 514 and parallels end wall 516 and enclosure seal surface 68.

Latch 520 has an elongate latch arm 522 extending from wall 514 to latch head 524. Latch arm 522 includes arm sides 526, 528 facing toward and away from enclosure 12. Latch head 524 has a latch cam surface 530 and a latch retention surface 532 facing outwardly from enclosure seal surface 68.

Figure 16:
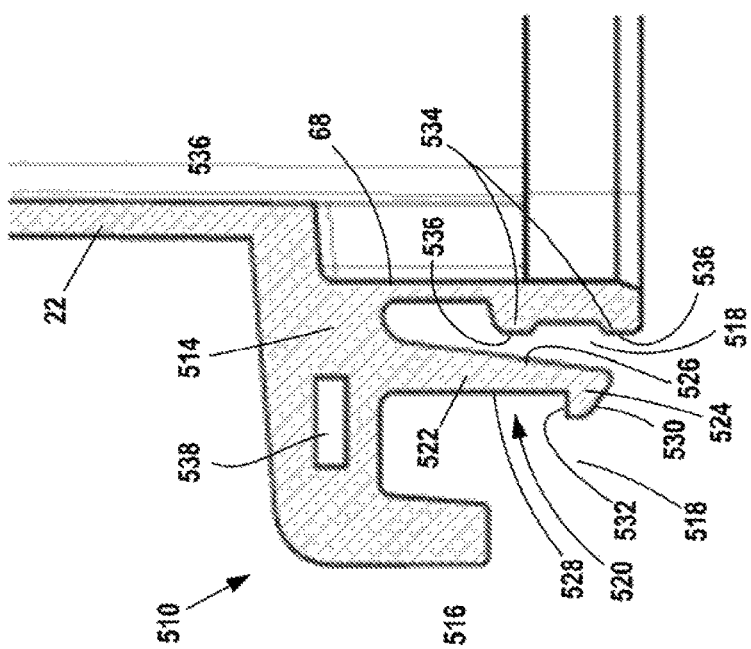
FIG. 16 is a sectional view taken along line 16-16 of FIG. 7.

Each latch sub-assembly 510 has two spaced over-deflection prevention bodies 534 extending outwardly from enclosure sides 22 or 24 into latch recess 518. Bodies 534 each have a latch arm contact surface 536 facing latch arm 522. The bodies 534 are spaced inwardly along enclosure seal surface 68. See FIG. 16.

Enclosure latch sub-assembly 510 has a security aperture 538 extending through wall 514.

Figure 9:
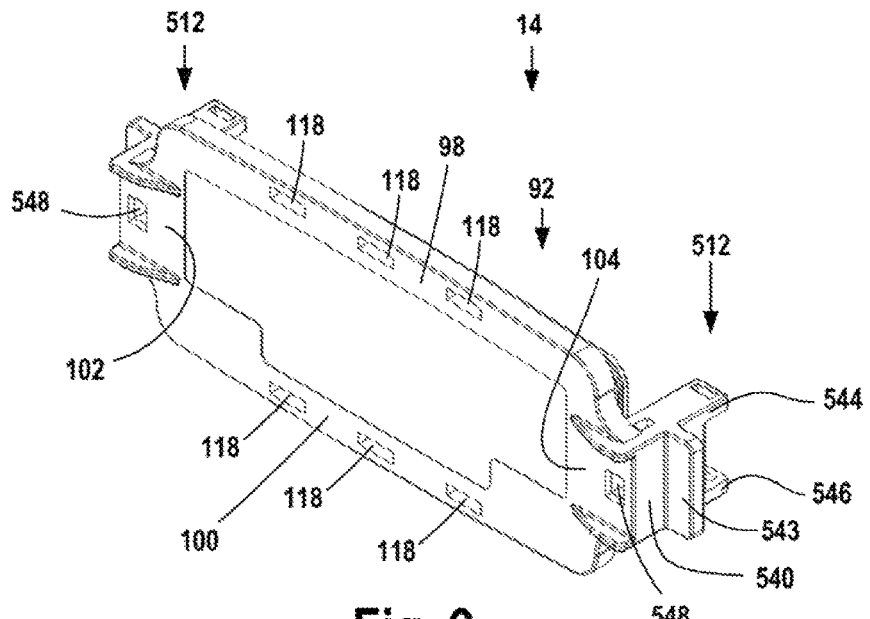
FIG. 9 is a perspective view of the assembly cover.
Figure 17:
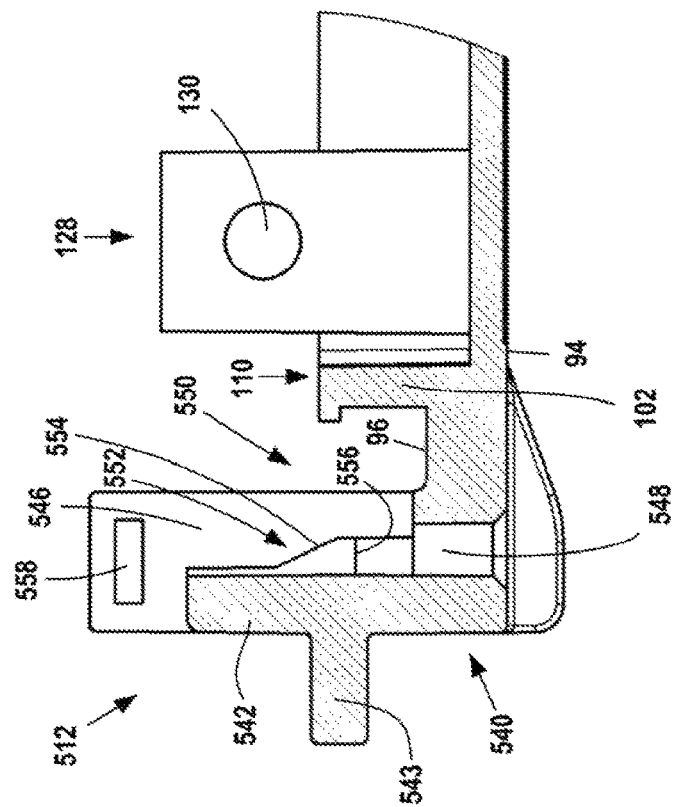
FIG. 17 is a sectional view taken along line 17-17 of FIG. 10.

Cover latch sub-assembly 512 has a sub-assembly body 540 joined to a cover side portion 102, 104. Sub-assembly body 540 has an engagement wall 542 extending away from cover rear face 96 and a stop wall 543 extending outwardly from cover 14. Top and bottom engagement walls 544, 546 likewise extend outwardly from cover read face 96. See FIG. 9 and 17.

Cover aperture 548 extends from cover front face 94, through latch sub-assembly 512 and to latch sub-assembly recess 550. Latch sub-assembly recess 550 is located between engagement walls 542, 544, 546 and seal mounting member 110. See FIG. 17.

Figure 11:
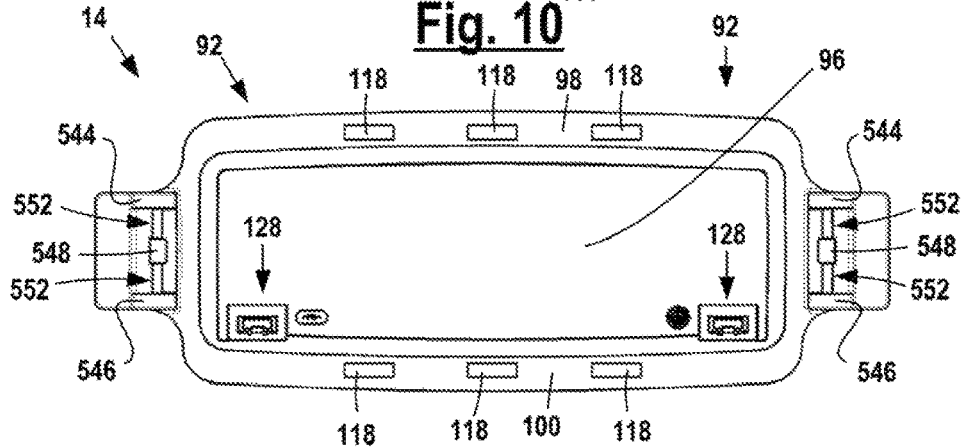
FIG. 11 is a rear view of the assembly cover.

Cover latch sub-assembly 512 also has latch keepers 552 extending away from engagement wall 542 and toward cover 14. Latch keepers 552 are located above and below cover aperture 548 as shown in FIG. 11. Latch keepers 552 have a cam surface 554 and a stop surface 556.

Cover latch sub-assembly 512 may have a security apertures 558 extending through engagement walls 544, 546.

Use of enclosure assembly 10 will now be explained.

Assembly elements form a secure, moisture proof enclosure when cover 14 is mounted on enclosure 12.

Figure 19:
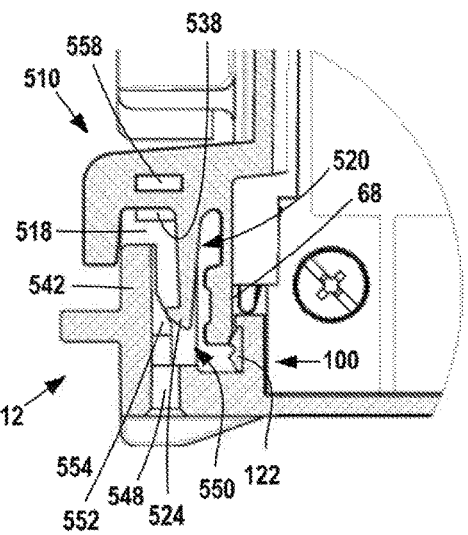
Figure 20:
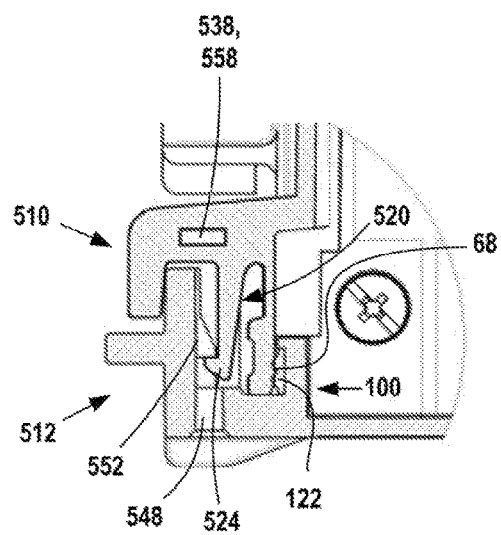

Cover 14 is mounted onto enclosure 12 by positioning cover rear face 96 over enclosure mouth 28. Cover 14 is then moved into enclosure mouth 28 so that cover circumferential seal mounting member 122 engages circumferential enclosure seal surface 68. FIG. 19 shows partial engagement between seal mounting member 122 and enclosure seal surface 68. FIG. 20 shows full engagement between seal mounting member 122 and enclosure seal surface 68.

Simultaneously, enclosure lugs 70 are inserted into corresponding lug apertures 118 on cover 14 so that lug retention surfaces 80 engages cover lug aperture retention surfaces 120. See FIG. 15.

After full cover mounting on the enclosure, engagement of enclosure lugs 70 in lug apertures 118 spaced along top and bottom lip portions 60, 62 and top and bottom cover portions 98, 100 prevents outward flexing of enclosure top and bottom walls 18, 20 away from cover 14. This locking physical connection of the cover on the enclosure secures maintenance of a moisture proof seal between seal mounting member 110 and enclosure seal surface 68. Outward flexing of walls 18 and 20 and formation of leak openings between the cover and enclosure is prevented.

Enclosure body top and bottom walls 18, 20 outwardly-curving top and bottom arches 82, 84 stabilize top and bottom walls 18, 20 against deforming forces that would cause outward flexing of walls 18, 20. Similar top and bottom arches 106, 108 in cover top and bottom portions 98, 100 are joined to enclosure top and bottom arches 82, 84 to additionally stabilize top and bottom walls 18, 20.

Each edge holder 200 secures PCB 400 from unintended dislodgment from enclosure 12.

Figure 28:
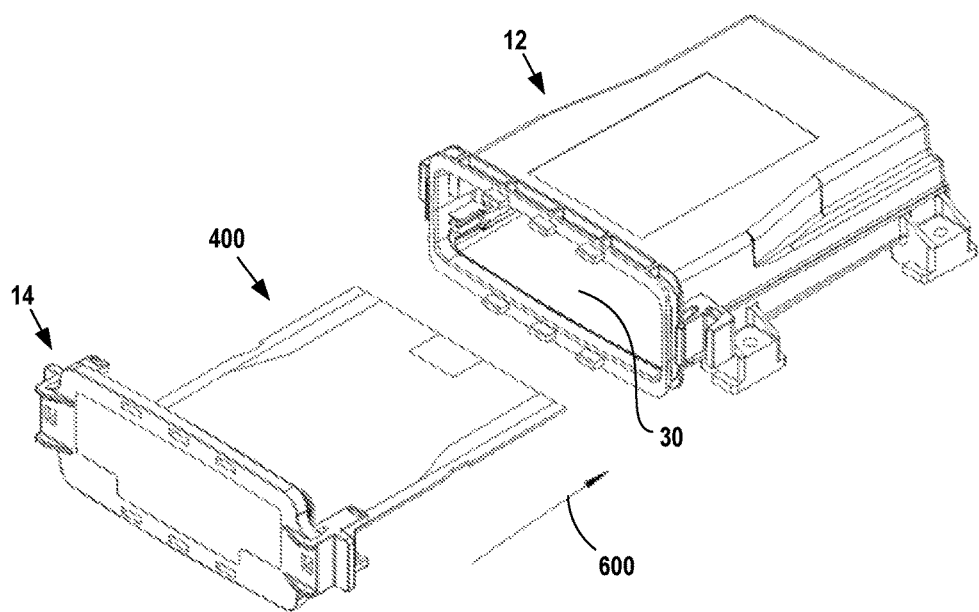
FIG. 28 is a perspective view showing insertion of the printed circuit board into the enclosure body.

Prior to installation of PCB 400 into enclosure 12, PCB 400 is mounted to cover 14 as described above. Cover 14 and mounted PCB 400 are inserted into enclosure 12 body cavity 30 in the direction of arrow 600 as shown in FIG. 28.

Figure 37:
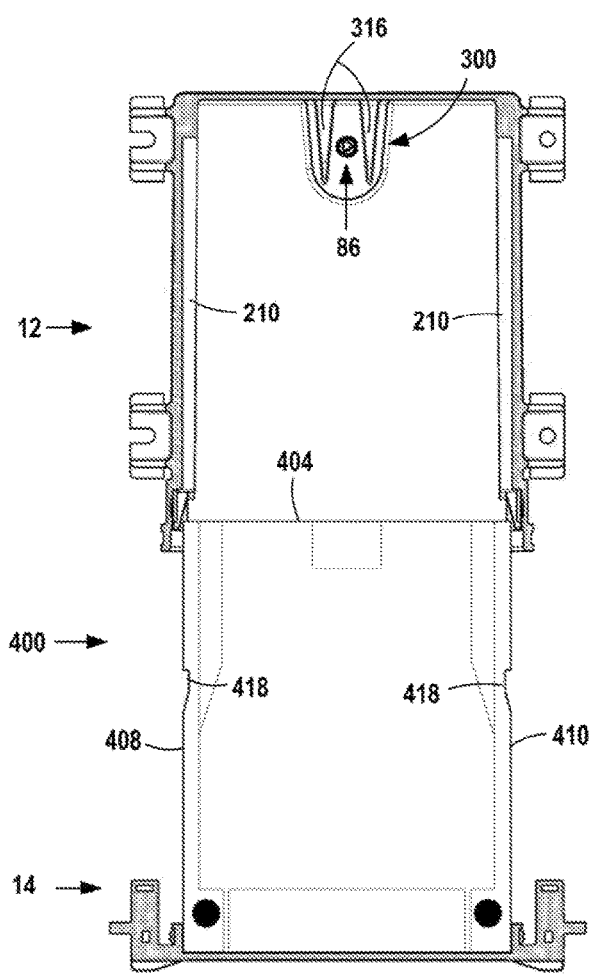
FIG. 37 is a sectional top view showing the beginning of insertion of a printed circuit board into the enclosure body.
Figure 38:
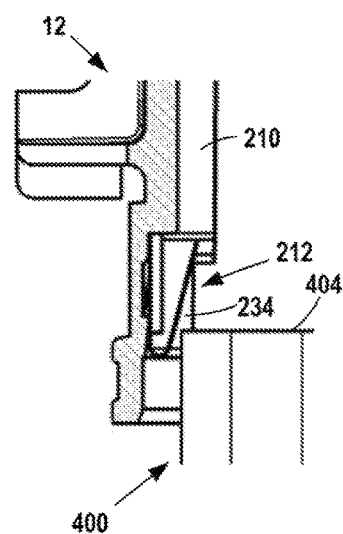
FIG. 38 is a detail view of FIG. 37 showing the slot latch.

Insertion of PCB 400 into enclosure 12 body cavity 30 is shown in FIG. 37. The front end 404 of PCB 400 is moved into cavity 30 with edges 408, 410 between upper and lower slot latch assembly walls 232, 234.

PCB 400 is inserted further into enclosure body cavity 30 by moving board edges 408, 410 into and along opposed PCB mounting slots 210. See FIG. 39. After partial insertion to the position shown in FIG. 39, spring slot latches 230 are compresses by the board edges. Mounting arms 256 of slot latches 230 on either side of enclosure 12 snap into and engage board retention notches 418 and the PCB is secured to the enclosure with end of the PCB supporting cover 14 exposed outside the enclosure. In this position, PCB 400 is partially removed from enclosure 12, which permits inspection, testing and service of exposed PCB components without the need to completely remove the PCB from the enclosure. In this position, PCB 400 is secured against accidental removal from enclosure 12 body by extension of latch mounting arms 256 into retention notches 418. Removal of PCB 400 outwardly from the enclosure requires use of a tool to disengage latch mounting arms 256 as explained below.

Figure 39:
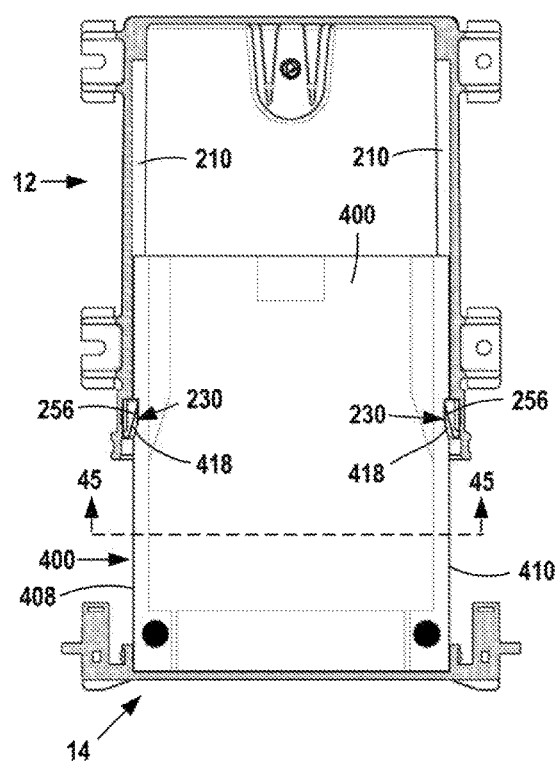
FIG. 39 is a sectional top view showing partial insertion and retention of a printed circuit board in the enclosure body.
Figure 40:
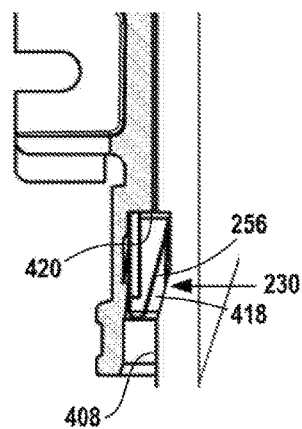
FIG. 40 is a detail view of FIG. 39 showing the slot latch.
Figures 41, 42:
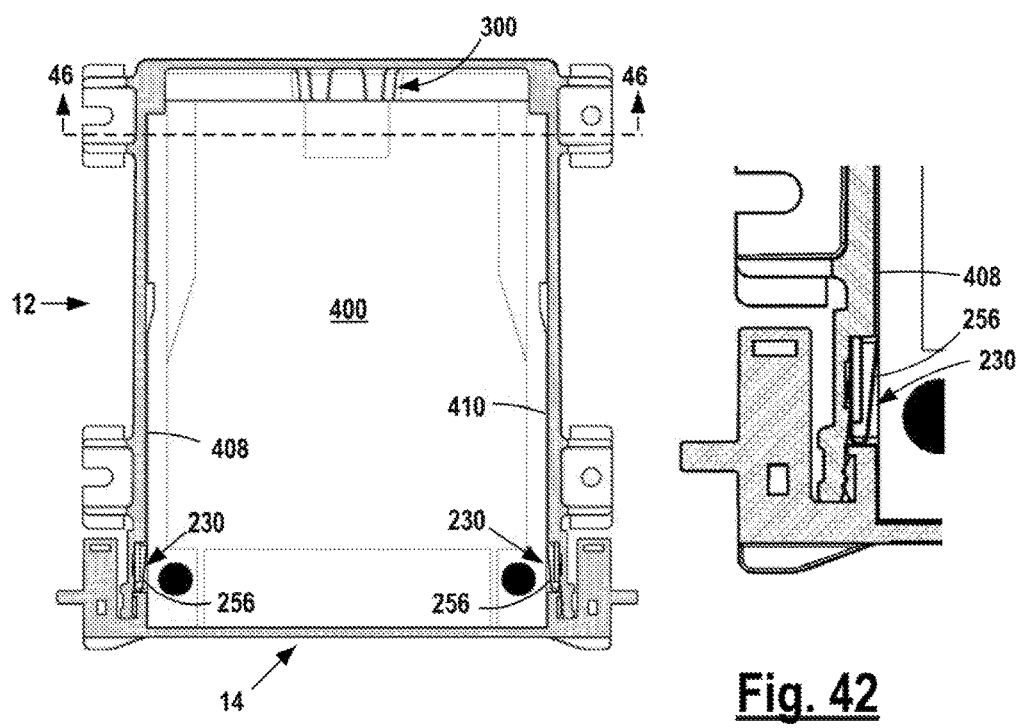
FIG. 41 is a sectional top view showing full insertion of a printed circuit board into the enclosure body.
FIG. 42 is a detail view of FIG. 41 showing the slot latch.

PCB 400 is fully inserted into the enclosure by puching the board inwardly from the position of FIG. 39 to the position of FIG. 41.

Slot latch 230 is illustrated in FIGS. 29-31. Latch 230 has a V-shaped latch body 254 that may be made of spring steel or a like material. Mounting arms 256 of slot latches 230 are compress and ride along against board edges 408 and 410. The lead end 404 of the PCB is moved into appropriate slot heights 224 and 226 at the rear of cavity 30.

Full insertion of PCB 400 into enclosure 12 body cavity 30 is shown in FIG. 41. In this position, cover 14 is seated on mouth 28 and the two slot latches 230 are compressed with latch mounting arms 256 held against board edges 408, 410. Latch assemblies 500 are fully engaged and board deformation assembly 300 engages PCB 400 as explained below.

Figure 43:
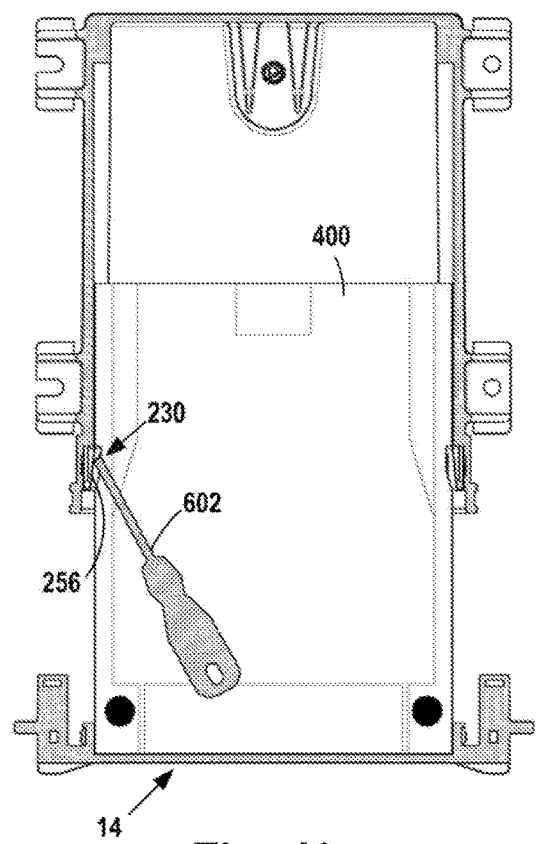
FIG. 43 is a sectional top view showing use of a tool to assist in removal of a printed circuit board from the enclosure body.
Figure 44:
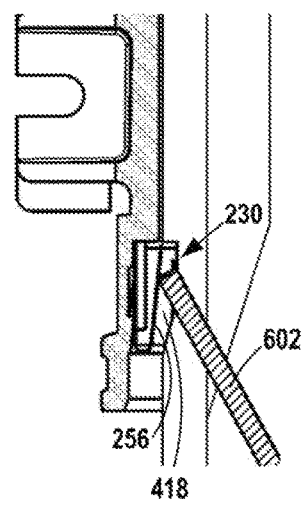
FIG. 44 is a detail view of FIG. 43 showing the slot latch.

FIG. 43 shows partial removal of PCB 400 from enclosure 12 similar to FIG. 39. Latch mounting arms 256 engage board retention notches 418 to prevent further withdrawal of PCB 400 from enclosure 12.

Elongate tool 602, which may be a screwdriver, is used to press latch mounting arms 256 away from board retention notches 418 and free the PCB for removal of PCB 400 from enclosure 12.

Figure 45:
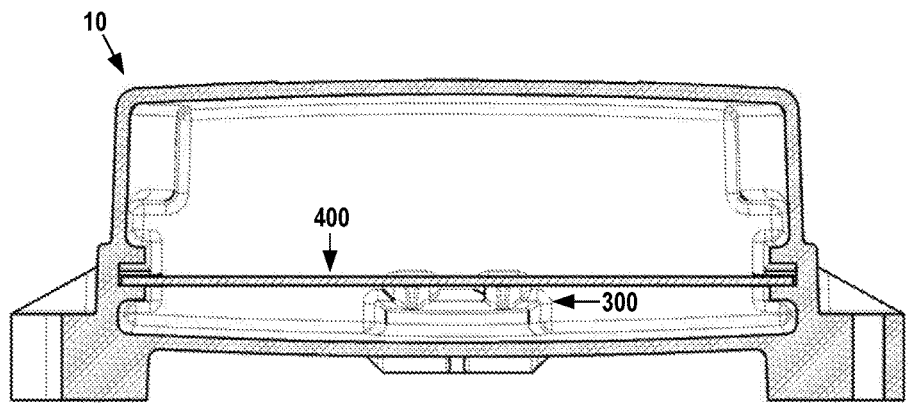
FIG. 45 is a sectional view taken along line 45-45 of FIG. 39.

FIG. 45 shows PCB 400 as positioned in FIG. 37, before it is fully inserted into enclosure 12. In this position PCB 400 is supported in opposed PCB mounting slots 210.

Figure 46:
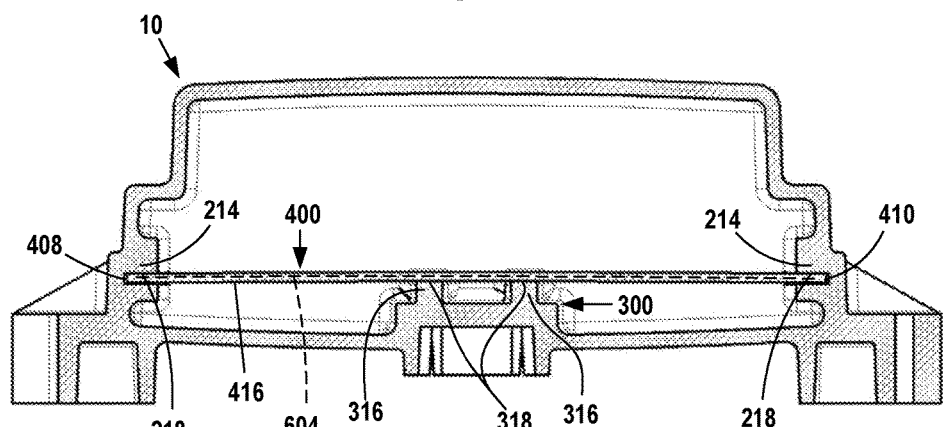
FIG. 46 is a sectional view taken along line 46-46 of FIG. 41.

FIG. 46 shows PCB 400 as positioned in FIG. 41 at full insertion into enclosure 12. In this position, PCB 400 engages board deformation assembly 300 so that the board engagement surfaces 318 on board engagement bodies 316 contact PCB bottom face 416 to elastically bend the center of PCB 400 up above PCB edges 408, 410. In this position, PCB 400 is bent up and has an outwardly-curving top arch 604 extending between PCB edges 408, 410.

PCB 400 is secured in enclosure 12 by board deformation assembly 300. A technician must apply an additional force to PCB 400 during board insertion into and removal from enclosure 12 to engage and disengaged PCB 400 with assembly 300.

When PCB 400 is inserted into assembly 300, PCB edges 408, 410 are held against the downwardly-facing retention surfaces 218 of upper slot walls 214. This holds PCB 400 between assembly 300 board engagement surfaces 318 and enclosure edge holder slot assembly 200 retention surfaces 218 to additionally secure PCB 400 in enclosure 12.

PCB 400 may also be secured in enclosure 12 by an interference fit between PCB 400 and slots 210. The height of slot 210 may vary to allow passage of PCB 400 along the slot until PCB 400 is brought into an interference fit at the portion of slot 210 having a reduced height 224 and 226. The different heights 224 and 226 of slot 210 allow interference fits with different thickness PCB boards as indicated above.

Latch assemblies 500 securely mount cover 14 onto enclosure 12.

Figure 18:
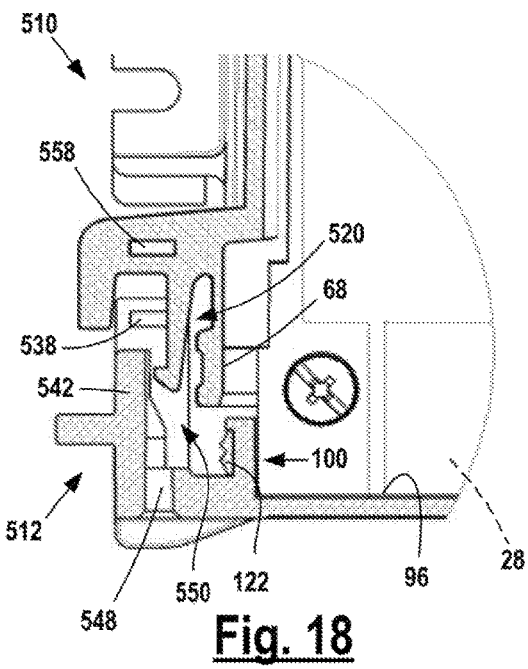
FIGS. 18-20 are sectional views showing latching of the cover to the body.

FIGS. 18 through 20 show engagement of one enclosure latch sub-assembly 510 and cover latch sub-assembly 512 as cover 14 is mounted onto enclosure 12.

First, cover 14 is positioned so that cover rear face 96 faces enclosure mouth 28 and cover engagement wall 542 is located in enclosure latch recess 518 as shown in FIG. 18. Cover 14 is then extended further into enclosure mouth 28, so that so that each latch head 524 extends into a cover latch sub-assembly recess 550 to engage cam surfaces 554 on latch keepers 552 as shown in FIG. 19. Cover 14 is then extended fully into enclosure mouth 28. As this position latch heads 524 fully engages latch keepers 552 to secure sub-assemblies 510 and 512 together as shown in FIG. 20.

When sub-assemblies 510 and 512 are secured together, sub-assembly 510 security aperture 538 and sub-assembly 512 security apertures 558 are aligned as shown in FIG. 20. A tampering indication security element such as a zip-tie or the like may be extended through and secured about aligned aperture 538, 558. The security elements protect the enclosure assembly 10 against unauthorized opening and, if removed, indicated unauthorized opening.

Cover 14 is removed from enclosure 12 by disengaging the two sub-assemblies 510 and 512. Each sub-assembly is disengaged by inserting an elongate tool 606 into a cover aperture 548 as shown in FIG. 21. Tool 606 is further extended into cover latch sub-assembly recess 550 to engage latch cam surface 530 and cam latch head 524 away from latch keepers 552 as shown in FIG. 22. Tool 606 may be a screwdriver.

Tool 606 is then fully extended into latch recess 518 to fully disengage latch head 524 from latch keepers 552 as shown in FIG. 23. Extension of tool 606 into latch recess 518 prevents re-engagement of cam latch head 524 to latch keepers 552 as sub-assembly 512 is disengaged outwardly from sub-assembly 510.

As tool 606 disengages latch head 524 from latch keepers 552, latch arm side 526 contacts latch arm contact surfaces 536 on over-deflection prevention bodies 534. The over-deflection prevention bodies 534 prevent over-deflection of latch 520 during full insertion of tool 606. See FIG. 23.

After latch head 524 is fully disengaged from latch keepers 552, sub-assembly 512 is disengaged outwardly from sub-assembly 510 allowing removal of cover 14 from enclosure 12 as shown in FIGS. 24 and 25.

While this disclosure discloses and describes various embodiments, it is understood that this is capable of modification and that the disclosure is not limited to the precise details set forth, but includes such changes and alterations as fall within the purview of the following claims.

We claim:

1. An assembly for housing an electrical component, the assembly comprising an enclosure body having an interior wall surrounding a cavity, a mouth opening into the cavity, a circuit board in the cavity, the circuit board having opposed board edges extending between board front and rear ends, one board edge having a board retention notch, a sliding connection removably mounting the circuit board on the enclosure body interior wall, said sliding connection comprising a slot first latch housing recess on the enclosure body interior wall, the slot latch housing recess extending away from the mouth, and a V-shaped slot latch in the slot latch housing recess adjacent to the mouth, the slot latch comprising a latch retention arm in the recess, a latch mounting arm overlying the latch retention arm and a spring bend joining the latch arms, the spring bend adjacent to the mouth, and the latch arms extending away from the spring bend and into the cavity, said circuit board having a fully inserted position wherein the circuit board is in the cavity, said slot latch retention arm engages the board edge away from the notch, and said circuit board having a partially inserted position wherein the slot latch retention arm extending into said board retention notch to secure the board to the body.

2. The assembly as in claim 1 wherein both board edges have a board retention notch, said sliding connection comprising a second slot latch housing recess on the enclosure body interior wall, and a second slot latch in the second mounting slot.

3. The assembly as in claim 2 wherein said mounting slots each have a first slot height proximate the mouth and a second slot height distal from the mouth, the first slot height greater than the second slot height.

4. The assembly as in claim 3 wherein the first slot height is greater than about 0.093 inches and the second slot height is less than about 0.093 inches.

5. The assembly as in claim 3 wherein the assembly comprises a cover closing the mouth, and a physical connection mounting the circuit board to the cover.

6. The assembly as in claim 5 including an electrical component on the circuit board, wherein the enclosure body or cover comprise apertures for conductors extending from the electrical component through the enclosure body or cover and outside the assembly for electrical connection to electrical components outside of the assembly enclosure and cover.

7. The assembly as in claim 6 including a pair of cover latch assemblies, each cover latch assembly including a first latch member on the enclosure body, a second latch member on the cover and a flexible latch movable between a first latch position securing the latch members together and a second unlatched position and means to prevent over-deflection of the latch during latching and unlatching.

8. The assembly as in claim 1 wherein the latch retention arm is substantially flat.

9. The assembly as in claim 1, wherein the slot latch is located entirely within the cavity.

10. An assembly for housing an electrical component, said assembly comprising:
an enclosure body having enclosure walls surrounding an interior cavity, an enclosure mouth opening into said cavity and an enclosure rear wall away from said mouth;
a slot on the interior of the cavity extending from said mouth toward said rear wall;
a V-shaped latch in the slot, the latch comprising a first portion secured to the body in the slot, a second portion overlying the first portion and extending along the slot to a latch end facing away from the mouth, and a bend joining the first and second portions, the bend facing the mouth;
a circuit board in the cavity, said circuit board having opposed board edges extending between board front and rear ends, one board edge having a board retention notch;
said one board edge in the slot;
wherein said circuit board having a fully inserted position in the cavity with said latch end engaging the board edge away from the notch, said circuit board having a partially inserted position in the cavity with said latch end extending into said board retention notch to secure the circuit board to the body in a partially inverted position.

11. The assembly as in claim 10 wherein said first and second latch portions are flat.

12. The assembly as in claim 10 said slot having a first slot height proximate the mouth and a second slot height proximate the enclosure rear wall, the first slot height greater than the second slot height.

13. The assembly as in claim 12 wherein the first slot height is greater than 0.093 inches and the second slot height is less than 0.093 inches.

14. The assembly as in claim 10 including a pair of cover latch assemblies, each cover latch assembly including a first latch member on the enclosure body, a second latch member on the cover and a flexible latch movable between a first latch position securing the latch members together and a second unlatched position, and means to prevent over-deflection of the latch during latching and unlatching.

15. The assembly as in claim 10 wherein said latch is formed from metal.

* * * * *

UNITED STATES PATENT AND TRADEMARK OFFICE
CERTIFICATE OF CORRECTION

PATENT NO.         : 9,967,993 B1
APPLICATION NO.    : 15/344773
DATED              : May 8, 2018
INVENTOR(S)        : Walker et al.

Page 1 of 1

It is certified that error appears in the above-identified patent and that said Letters Patent is hereby corrected as shown below:

In the Claims

Column 12, Line 43, replace "inverted" with --inserted--.

Signed and Sealed this
Nineteenth Day of June, 2018

Andrei Iancu
*Director of the United States Patent and Trademark Office*